United States Patent
De Weerdt

(10) Patent No.: US 10,634,753 B2
(45) Date of Patent: Apr. 28, 2020

(54) MR IMAGING WITH MOTION DETECTION

(71) Applicant: KONINKLIJKE PHILIPS N.V., Eindhoven (NL)

(72) Inventor: Elwin De Weerdt, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 29 days.

(21) Appl. No.: 15/742,902

(22) PCT Filed: Jul. 13, 2016

(86) PCT No.: PCT/EP2016/066687
§ 371 (c)(1),
(2) Date: Jan. 9, 2018

(87) PCT Pub. No.: WO2017/009391
PCT Pub. Date: Jan. 19, 2017

(65) Prior Publication Data
US 2018/0210058 A1 Jul. 26, 2018

(30) Foreign Application Priority Data
Jul. 15, 2015 (EP) .................................... 15176760

(51) Int. Cl.
*G01R 33/565* (2006.01)
*G01R 33/48* (2006.01)
(Continued)

(52) U.S. Cl.
CPC ... *G01R 33/56509* (2013.01); *G01R 33/4818* (2013.01); *G01R 33/4822* (2013.01);
(Continued)

(58) Field of Classification Search
CPC .......... G01R 33/56509; G01R 33/5611; G01R 33/5608; G01R 33/4822; G01R 33/4826; G01R 33/4818
(Continued)

(56) References Cited

U.S. PATENT DOCUMENTS 5,382,902 A * 1/1995 Taniguchi .......... G01R 33/5676
324/307
5,612,619 A 3/1997 Feinberg
(Continued)

FOREIGN PATENT DOCUMENTS

CN 101995561 B 3/2011
CN 103584864 A 2/2014
(Continued)

OTHER PUBLICATIONS

Pipe, "Motion Correction With Propeller MRI" Magnetic Resonance in Medicine, vol. 42, 1999, p. 963-969.
(Continued)

*Primary Examiner* — Christopher P McAndrew

(57) ABSTRACT

The invention relates to a method of MR imaging of an object (10) placed in the examination volume of a MR device (1). It is an object of the invention to provide a method that enables efficient motion-compensation and/or motion-correction and that is compatible with Cartesian sampling of k-space. The method of the invention comprises: —generating MR signals by subjecting the object (10) to a MR imaging sequence of at least one RF pulse and switched magnetic field gradients; —acquiring the MR signals as a plurality of temporally successive subsets, each subset comprising a number of k-space profiles with sub-sampling of k-space, wherein the subsets complement each other to form a fully sampled set of k-space profiles; —reconstructing a single-subset MR image from each subset; —computing a gradient MR image from each single-
(Continued)

subset MR image; and —detecting motion by comparing the gradient MR images with each other. Moreover, the invention relates to a MR device (1) and to a computer program for a MR device (1).

18 Claims, 3 Drawing Sheets

(51) Int. Cl.
G01R 33/56 (2006.01)
G01R 33/561 (2006.01)

(52) U.S. Cl.
CPC ..... *G01R 33/4826* (2013.01); *G01R 33/5608* (2013.01); *G01R 33/5611* (2013.01)

(58) Field of Classification Search
USPC .......................................................... 324/309
See application file for complete search history.

(56) References Cited

U.S. PATENT DOCUMENTS

| | | | |
|---|---|---|---|
| 6,144,874 A * | 11/2000 | Du | G01R 33/5676 324/307 |
| 8,073,522 B2 | 12/2011 | Stemmer | |
| 8,131,047 B2 | 3/2012 | Li | |
| 8,155,417 B2 | 4/2012 | Piron et al. | |
| 8,306,299 B2 | 11/2012 | Samsonov et al. | |
| 9,429,637 B2 | 8/2016 | Krueger et al. | |
| 2002/0158632 A1* | 10/2002 | Sodickson | G01R 33/3415 324/307 |
| 2003/0025500 A1* | 2/2003 | Bydder | G01R 33/54 324/318 |
| 2003/0102864 A1 | 6/2003 | Welch et al. | |
| 2007/0156045 A1* | 7/2007 | Mistretta | G01R 33/4824 600/410 |
| 2009/0009167 A1* | 1/2009 | Du | G01R 33/4824 324/307 |
| 2010/0001727 A1* | 1/2010 | Frydman | G01R 33/4822 324/310 |
| 2010/0171497 A1* | 7/2010 | Iwadate | G01R 33/5676 324/309 |
| 2012/0243756 A1* | 9/2012 | Samsonov | G01R 33/56509 382/131 |
| 2013/0158384 A1 | 6/2013 | Jeong et al. | |
| 2014/0108164 A1 | 4/2014 | Park | |
| 2015/0015691 A1 | 1/2015 | Forman et al. | |

FOREIGN PATENT DOCUMENTS

| | | |
|---|---|---|
| WO | 20080132659 A2 | 11/2008 |
| WO | 2014085027 A1 | 6/2014 |
| WO | 2015086415 A1 | 6/2015 |

OTHER PUBLICATIONS

Sarkar et al "On Optimal Infinite Impuse Resonance Edge Detection Filters" IEEE Transactions on Pattern Analysis and Manchine Intelligence, vol. 14, No. 11, Nov. 1, 1991 p. 1154-1171.

* cited by examiner

MR IMAGING WITH MOTION DETECTION

CROSS REFERENCE TO RELATED APPLICATIONS

This application is a U.S. national phase application of International Application No. PCT/EP2016/066687, filed on Jul. 13, 2016, which claims the benefit of EP Application Serial No. 15176760.5 filed on Jul. 15, 2015 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency).

From a macroscopic point of view, the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

The transverse magnetization and its variation can be detected by means of receiving RF coils which are arranged and oriented within an examination volume of the MR device in such a manner that the variation of the magnetization is measured in the direction perpendicular to the z-axis.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body.

The signal data obtained via the receiving coils correspond to the spatial frequency domain and are called k-space data. The k-space data usually include multiple acquired k-space profiles (lines in k-space) of different phase encoding. Each k-space profile is digitized by collecting a number of samples. A set of k-space data is converted to an MR image by means of Fourier transformation.

In a variety of MRI applications, motion of the examined patient can adversely affect image quality. Acquisition of sufficient MR signals for reconstruction of an image takes a finite period of time. Motion of the patient during that finite acquisition time typically results in motion artifacts in the reconstructed MR image. In conventional MR imaging approaches, the acquisition time can be reduced to a very small extent only, when a given resolution of the MR image is specified. In the case of medical MR imaging, motion artifacts can result for example from cardiac and respiratory cyclic motion, and other physiological processes, as well as from patient motion resulting in blurring, misregistration, deformation and ghosting artifacts.

Different approaches have been developed to overcome problems with respect to motion in MR imaging. Among these is the so-called PROPELLER imaging technique. In the PROPELLER concept (Periodically Rotated Overlapping ParalEL Lines, see James G. Pipe: 'Motion Correction With PROPELLER MRI: Application to Head Motion and Free-Breathing Cardiac Imaging', Magnetic Resonance in Medicine, vol. 42, 1999, pages 963-969), MR signal data are acquired in k-space in N strips, each consisting of L parallel k-space lines, corresponding to the L lowest frequency phase-encoding lines in a Cartesian-based k-space sampling scheme. Each strip, which is also referred to as k-space blade, is rotated in k-space by an angle of, for example, 180°/N, so that the total MR data set spans a circle in k-space. If a full k-space data matrix having a diameter M is desired, then L and N may be chosen so that $L \times N = M \times \pi/2$. One essential characteristic of PROPELLER is that a central circular portion in k-space, having a diameter L, is acquired for each k-space blade. This central portion can be used to reconstruct a low-resolution MR image for each k-space blade. The low-resolution MR images are compared to each other to detect in-plane displacements and phase errors, which are due to patient motion. A suitable technique such as cross-correlation is employed to determine which k-space blades were acquired with significant motion-induced displacement or include other types of artifacts. As the MR signal data are combined in k-space before the reconstruction of the final MR image, the MR data from k-space blades are weighted according to the artifact level detected by cross-correlating the k-space blades, so that artifacts are reduced in the final MR image. The PROPELLER technique makes use of oversampling in the central portion of k-space in order to obtain an MR image acquisition technique that is robust with respect to motion of the examined patient during MR signal acquisition.

However, drawbacks of the known PROPELLER approach result from the fact that its application is restricted to the specific circular acquisition of k-space profiles from a number of successively rotated blades. The highly effective motion-compensation and motion-correction concept of the PROPELLER approach is not compatible with Cartesian k-space sampling schemes.

As an alternative, the so-called navigator technique has been developed to overcome problems with respect to motion by prospectively adjusting the imaging parameters, which define the location and orientation of the volume of interest within the imaging volume. In the navigator technique hereby, a set of navigator signals is acquired from a spatially restricted volume that crosses, for example, the diaphragm of the examined patient to determine the breathing motion of the patient. For registering the navigator signals, so-called 2D RF pulses may be used. These excite the spatially restricted navigator volume, for example of pencil beam shape, which is read out using a gradient echo. Other ways to detect the motion-induced momentary position of the volume of interest is the acquisition of two-dimensional sagittal slices that are positioned at the top of the diaphragm, or the acquisition of three-dimensional low-resolution data sets. The respective navigator volume is interactively placed in such a way that a displacement value indicating the instantaneous position of the moving anatomy can be reconstructed from the acquired navigator signals and used for motion correction of the volume of interest in real time. The navigator technique is primarily used for minimizing the effects of breathing motion in body and cardiac exams where respiratory motion can severely deteriorate the image quality. Gating and image correction based on the MR navigator signals may be used to reduce these artifacts.

However, a drawback of the navigator technique is that additional acquisition of the navigator signals is required which results in an extension of the overall scan time. Moreover, the known navigator methods are difficult to apply if the volume of interest, from which the MR signals for imaging are to be acquired, partially overlaps with the navigator volume. If the navigator volume is (at least partly) superimposed upon the respective volume of interest, the image quality may be degraded due to incorrect detection of the motion state or due to saturation of the nuclear magnetization within the navigator volume.

The U.S. Pat. No. 6,144,874 concerns an magnetic resonance imaging method in which central k-pace vies and peripheral k-space views are acquired in a narrow and wider acquisition window, respectively. The k-space views are acquired upon first and second respiratory gating signals.

SUMMARY OF THE INVENTION

From the foregoing it is readily appreciated that there is a need for an improved MR imaging technique. It is consequently an object of the invention to provide a method that enables efficient motion-compensation and/or motion-correction and that is compatible with Cartesian sampling of k-space.

In accordance with the invention, a method of MR imaging of an object placed in the examination volume of a MR device is disclosed. The method comprises the steps of:
  generating MR signals by subjecting the object to a MR imaging sequence of at least one RF pulse and switched magnetic field gradients;
  acquiring the MR signals as a plurality of temporally successive subsets, each subset comprising a number of k-space profiles with sub-sampling of k-space, wherein the subsets complement each other to form a fully sampled set of k-space profiles;
  reconstructing a single-subset MR image from each subset;
  computing a gradient MR image from each single-subset MR image; and
  detecting motion by comparing the gradient MR images with each other.

The gist of the invention is the application of the motion detection/correction approach of the above-described PROPELLER technique to other kinds of k-space sampling, particularly Cartesian k-space sampling. The invention enables a fast and robust motion detection without the need of additional acquisition of navigators.

According to the invention, MR signals are acquired by any established imaging sequence, for example a spin echo sequence or a gradient echo sequence, as a plurality of subsets in temporal succession. Each subset comprises a number of k-space profiles, wherein the k-space profiles of each subset are acquired with sub-sampling. This means that the k-space sampling density of each subset is below the Nyquist threshold with respect to the field-of-view (FOV) to be imaged. The thus reduced number of phase encoding steps enables the acquisition of each subset within a short period of time. The duration of the acquisition of a single subset should be short in comparison to the typical timescale of the expected motion of the object such that each subset essentially reflects a certain motion state of the object. In a typical scenario of medical imaging of a human object, the acquisition of a single subset should preferably take less than, for example, 100 ms, comparable to the duration of the acquisition of a single k-space blade in PROPELLER imaging. The best performance of the method of the invention will be obtained using as large as possible subsets (in terms of the number of k-space profiles per subset) as long as the k-space data of each subset can be attributed to a single motion state. If the typical time scale of the relevant motion is known, the number of k-space profiles acquired per subset can be determined accordingly.

A single-subset MR image is reconstructed from each subset according to the invention. The k-space data of the subsets complement each other to form a fully sampled set of k-space profiles. In other words, each subset covers other locations in k-space than the other subsets. The consequence is that the single-subset MR images have different contents and cannot directly be compared to each other (or cross-correlated) like in PROPELLER imaging for detecting motion.

The essential feature of the invention is that a gradient MR image is computed from each single-subset MR image. Within the meaning of the invention, a gradient MR image is a MR image derived from the respective single-subset MR image, whereby the influence of the central region of k-space (the low spatial frequency information), which contains the contrast information, is reduced or even fully removed in the gradient MR image. For example, each gradient MR image may contain the voxel-vise spatial derivatives of the image values (in at least one spatial direction) of the corresponding single-subset MR image. However, other methods or transformations (e.g. wavelet transformation) may be used to reduce the influence of inner k-space. It is an insight of the invention that there is significantly less difference between the gradient MR images than between the single-subset MR images. It turns out that the cross-correlation between the MR images containing spatial derivative content (the gradient MR images) is rather high and motion-dependent. If there is motion between the acquisition of two subsets, the cross-correlation of the respective gradient MR images drops significantly. This is exploited by the invention. Motion is detected according to the invention by comparing the gradient MR images with each other. The comparison may be performed by computing the cross-correlation of each pair of gradient images. The cross-correlation is particularly well-suited as a scalar measure of similarity of the gradient MR images, like the cross-correlation of the single-blade images in PROPELLER imaging. The cross-correlation may be computed on the basis of the gradient MR images being magnitude images. However, the cross correlation may also be based on complex gradient MR images after performing a linear phase correction to compensate for the shift in position between the subsets in k-space.

In a preferred embodiment of the invention, a motion-compensated MR image is reconstructed from the fully sampled set of k-space profiles, wherein the subsets are weighted according to the detected motion. The subsets are combined into the fully sampled set of k-space profiles by weighted superposition. The weighted superposition enables an effective and targeted reduction of motion-induced image artifacts in the reconstructed MR image. The weighting factors of the weighted superposition are derived from the comparison of the gradient MR images so that image artifacts are avoided by applying a reduced weighting to the motion-corrupted subsets.

In an alternative embodiment, motion correction may be applied to at least one of the subsets according to the detected motion such that a motion-corrected MR image can be reconstructed from the fully sampled set of k-space profiles formed from the motion-corrected subsets. As in conventional PROPELLER imaging, the method of the invention may comprise the step of estimating and correcting motion-induced displacements and phase errors in the subsets. For example, displacements (translation and/or rotation) and phase errors, which are caused by patient motion, can be derived from the comparison of the gradient MR images. These factors may be corrected for in each subset in accordance with the invention prior to reconstructing the motion-corrected MR image. The invention thus provides a MR imaging method that is robust with respect to motion of the examined patient during MR signal acquisition.

According to another alternative, one or more motion-corrupted subsets are re-acquired, such that a final MR image is reconstructed from the fully sampled set of k-space profiles formed from the not motion-corrupted subsets and the re-acquired subsets. Motion-corrupted subsets are identified by the comparison of the gradient MR images. The respective subsets are then re-acquired. Optionally, the FOV of the k-space sampling is adapted in the step of re-acquiring the subsets according to the detected motion. In this way, the FOV may follow the detected motion of the imaged object.

Preferably, all subsets acquired according to the invention cover the same pre-determined region of k-space corresponding to the respective imaging task. The subsets may be acquired using Cartesian sampling of k-space, wherein each subset comprises a number of equidistant, parallel k-space profiles. In other words, the k-space profiles of each subset are evenly spread out over k-space, wherein one subset differs from another subset only in terms of the k-space locations of the individual k-space profiles, with a constant offset between the measured k-space profiles of different subsets. This is the typical k-space acquisition scheme of a multi-echo imaging sequence (for example a 'turbo' spin echo—TSE sequence), wherein each subset corresponds to a train of MR echo signals generated in a single 'shot' (i.e. after a single RF excitation) of the multi-echo imaging sequence. However, the imaging sequence used in accordance with the invention may be any conventional spin echo or gradient echo sequence with suitable ordering of the acquisition of the k-space profiles.

Alternatively, the subsets may be acquired using non-Cartesian sampling patterns, such as multi-shot spiral scanning (with interleaved spiral k-space trajectories) or radial scanning. Basically, the k-space sampling patterns/trajectories of the subsets to be compared should have the same geometry which is either translated in k-space (like in the above-described case of Cartesian sampling) or rotated (for spiral/radial scanning).

In yet another preferred embodiment of the invention, the subsets may comprise three-dimensional or higher-dimensional k-space data. The method of the invention is equally well-suited for two-dimensional and three-dimensional MR imaging as well as higher-dimensional MR imaging, such as dynamic MR imaging or spectroscopic MR imaging, for example.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
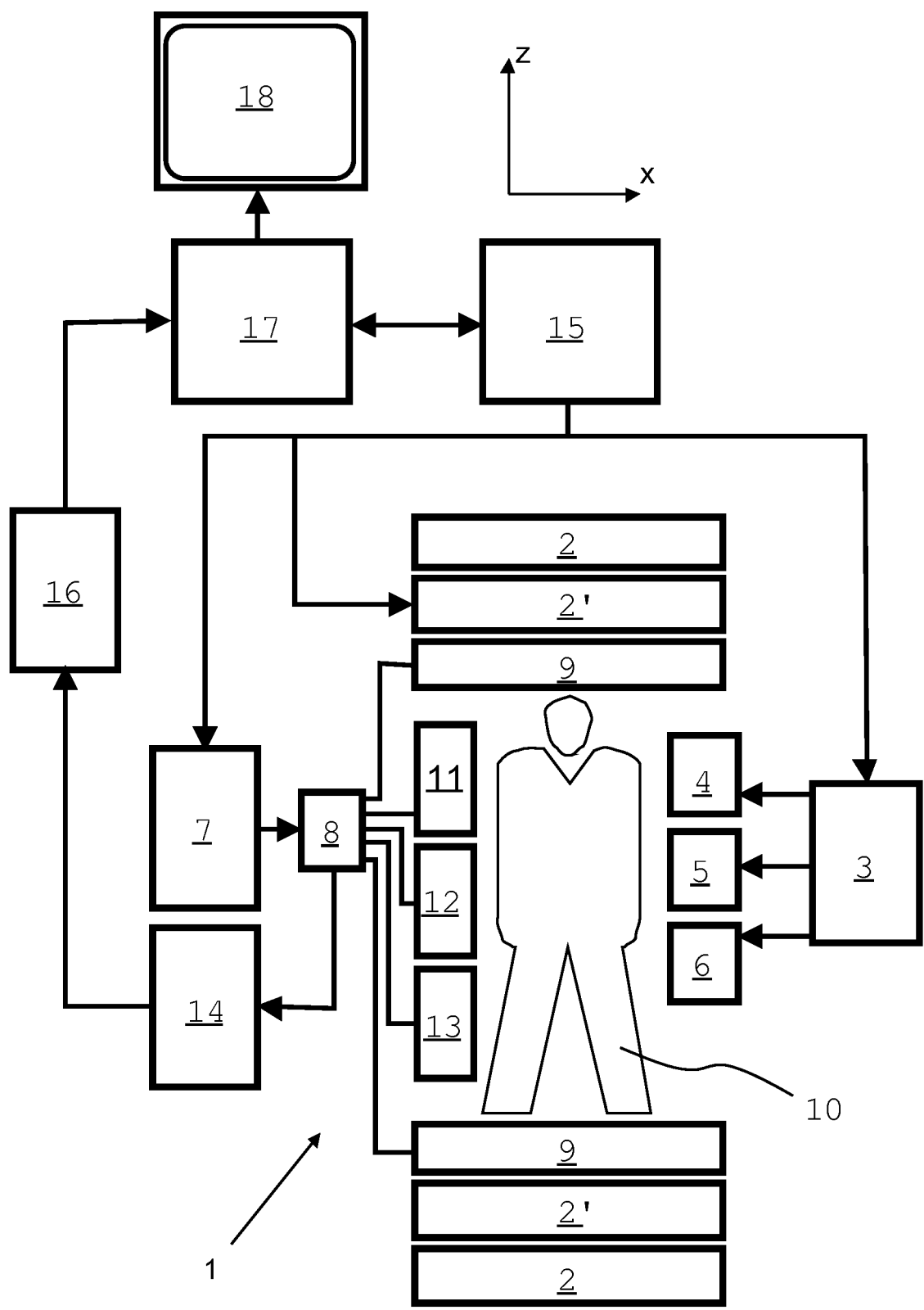
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
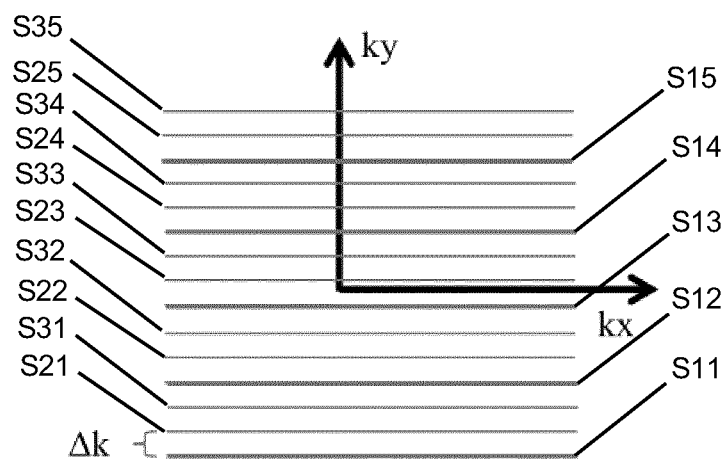
FIG. 2 schematically illustrates a Cartesian acquisition of k-space profiles according to the invention.

FIG. 2 illustrates a Cartesian k-space sampling scheme according to an embodiment of the invention.

The so-called turbo spin echo (TSE) sequence is a well-known multi-echo imaging sequence. One 'shot' of the TSE sequence comprises an initial RF pulse for excitation of magnetic resonance followed by a plurality of rapidly applied (typically 180°) refocusing RF pulses generating a train of differently phase-encoded spin echo signals. The echo signals are acquired, wherein each echo signal represents a k-space profile, i.e. a one-dimensional sample of k-space, the position of the k-space profile in k-space being determined by the applied frequency encoding and phase encoding switched magnetic field gradients of the sequence.

The so-called turbo factor is the number of echoes acquired after each excitation. Typically, a plurality of shots of the multi-echo sequence is applied for completely sampling k-space in order to be able to reconstruct a MR image from the acquired k-space profiles. TSE sequences are applied today in almost all applications. Despite its wide use it is known to be very sensitive to motion due to the segmented k-space distributed acquisition. Small movements of the imaged object can introduce ghosts overlapping with the anatomy of interest disturbing the overall diagnostic value of a scan.

According to the invention, the k-space profiles acquired during one shot of the TSE sequence constitute one subset of a number of temporally successively acquired subsets. In the embodiment shown in FIG. 2, three shots of a TSE sequence with turbo factor 5 are applied to sample k-space. The horizontal lines in the diagram of FIG. 2 represent the echo signals generated by the TSE sequence. The k-space profiles designated by S11-S15 are acquired during the first shot and constitute the first subset. The k-space profiles designated by S21-S25 are acquired during the second shot and constitute the second subset, while the k-space profiles designated by S31-S35 are acquired during the third shot and constitute the third subset. Each subset comprises five k-space profiles which sample k-space with sub-sampling. The three subsets complement each other to form a fully sampled set of k-space profiles. The difference Δk between the k-space profiles of the different subsets determines the size of the FOV in the phase-encoding direction ky.

Figure 3:
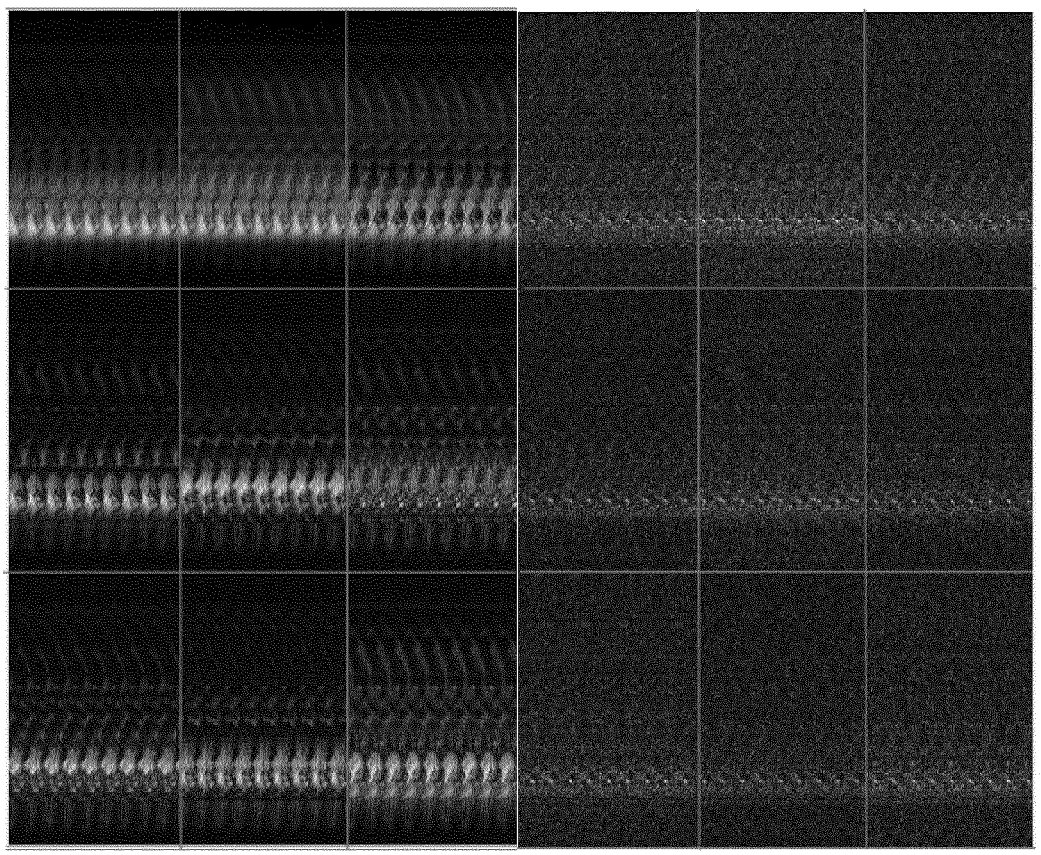
FIG. 3 shows single-subset MR images and corresponding gradient MR images used for motion-detection according to the invention.

According to the invention, a single-subset MR image is reconstructed from each subset. This is illustrated in FIG. 3. The left nine MR images shown in FIG. 3 are the single-subset MR images reconstructed from the echo signals acquired as illustrated in FIG. 2 using a TSE sequence with nine shots and a turbo factor of 33 (head scan). As can be seen, the contrast in the nine single-subset MR images differs significantly as the subsets cover different locations in k-space. According to the invention, a gradient MR image is reconstructed from each single-subset MR image. The right nine MR images in FIG. 3 are the corresponding gradient MR images derived from the single-subset MR images shown in the left part of FIG. 3 by computing the voxel-vise spatial derivatives of the image values in the phase-encoding direction ky. As can be seen, the contents of the nine gradient MR images show a much higher degree of similarity than the single-subset MR images.

Figure 4:
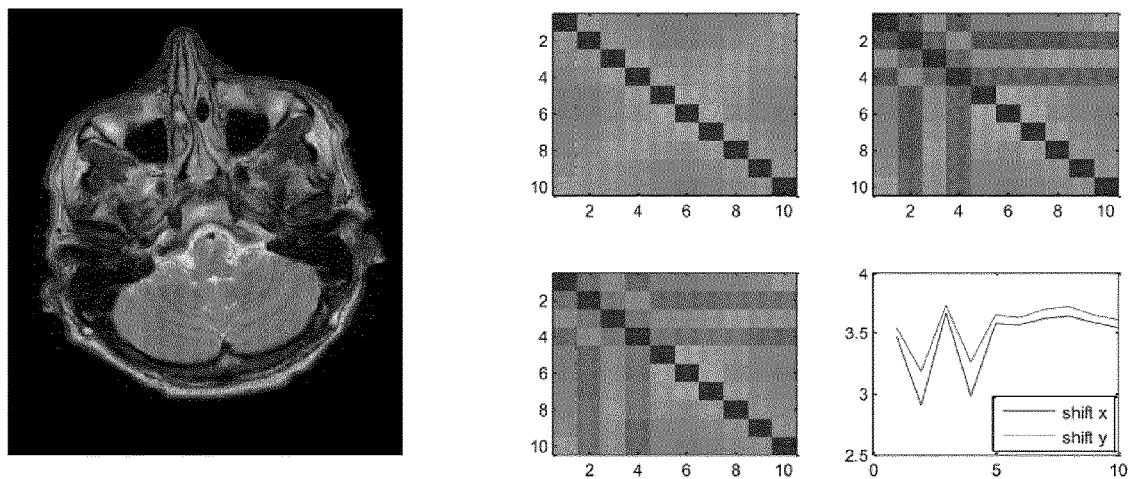
FIG. 4 illustrates the motion-detection approach of the invention in combination with TSE scanning.

FIG. 4 illustrates the motion detection scheme of the invention. Motion is detected by comparing the gradient MR images with each other. This is performed by computing the pairwise cross-correlations of the gradient MR images. In the embodiment shown in FIG. 4, MR signals are acquired using a TSE sequence with ten shots and a turbo factor of 30. The top middle diagram shows the correlation matrix for the case of no motion corruption. The matrix has ten lines and ten columns corresponding to the number of shots of the TSE sequence, i.e. the number of subsets within the meaning of the invention. Each field of the matrix comprises the value of the cross-correlation of the pair of gradient MR images computed from the respective single-subset MR images. In order to demonstrate the principle of the invention, shots 2 and 4 are motion-corrupted by introducing a shift by one voxel. The top right diagram shows the correlation matrix for a shift in the x-direction, while the bottom middle diagram shows the correlation matrix for a shift in the y-direction. In both cases, a significant drop of the cross-correlation is observed in columns 2 and 4 and lines 2 and 4 of the respective correlation matrix. The bottom right diagram shows the summation of the cross-correlations over the columns for each line of the respective matrix. The diagram clearly reflects the drop of the cross-correlations in lines 2 and 4 for both shift directions. This summation can be used according to the invention as a motion detection-measure. Low values indicate a low correlation of the respective gradient MR-image with the other gradient MR images and, thus, an increased probability of motion corruption. This may be used, for example, to reconstruct a motion-compensated MR image from the fully samples set of k-space profiles formed from the entirety of the subsets, wherein the subsets are weighted according to the motion detection-measure. Alternatively, re-acquisition could be initiated automatically for those subsets for which the motion detection-metric is below a given threshold. A correspondingly reconstructed MR image (head image) is shown on the left in FIG. 4.

While the invention has been described above with reference to a TSE imaging sequence, it has to be noted that other known imaging sequences (such as TFE, FFE or SE) can be used as well with a corresponding ordering of the acquired k-space profiles.

The concept of the invention can be extended to 3D or higher-dimensional imaging in a straight forward fashion, for example using subsets comprising k-space profiles that are phase-encoded in the ky and kz directions and evenly spread out over three-dimensional k-space. Each subset then comprises a number of equidistant, parallel k-space profiles (extending along the frequency-encoding direction kx). One subset differs from another subset in terms of the k-space locations of the individual k-space profiles, with constant offsets Δky and Δkz between the measured k-space profiles of the different subsets in the two phase-encoding directions ky and kz.

The invention claimed is:

1. A method of magnetic resonance (MR) imaging of an object placed in the examination volume of a MR device, the method comprising the steps of:
    generating MR signals by subjecting the object to a MR imaging sequence of at least one RF pulse and switched magnetic field gradients;
    acquiring the MR signals as a plurality of temporally successive subsets, each subset comprising a number of k-space profiles with sub-sampling of k-space, wherein the subsets complement each other to form a fully sampled set of k-space profiles;
    reconstructing a single-subset MR image from each subset;
    computing a gradient MR image from each single-subset MR image; and
    detecting motion by comparing the gradient MR images with each other;
    applying motion correction to at least one of the subsets according to the detected motion; and
    reconstructing a motion-corrected MR image from the fully sampled set of k-space profiles formed from the motion-corrected subsets.

2. The method of claim 1, further comprising:
    reconstructing a motion-compensated MR image from the fully sampled set of k-space profiles, wherein the subsets are weighted according to the detected motion.

3. The method of claim 1, further comprising:
    re-acquiring one or more motion-corrupted subsets; and
    reconstructing a final MR image from the fully sampled set of k-space profiles formed from the not motion-corrupted subsets and the re-acquired subsets.

4. The method of claim 3, wherein the field-of-view of the k-space sampling is adapted in the step of re-acquiring the subsets according to the detected motion.

5. The method of claim 1, wherein the step of detecting motion includes computing the cross-correlation for each pair of gradient images.

6. The method of claim 1, wherein translation and/or rotation parameters of the detected motion are derived by comparing the gradient images with each other.

7. The method of claim 1, wherein all subsets cover the same pre-determined region of k-space.

8. The method of claim 1, wherein the subsets are acquired using Cartesian sampling of k-space and each subset comprises a number of equidistant, parallel k-space profiles.

9. The method of claim 1, wherein the imaging sequence is a multi-echo imaging sequence comprising a number of shots, wherein each subset corresponds to a train of MR echo signals generated in a single shot of the multi-echo imaging sequence.

10. The method of claim 1, wherein the subsets are acquired using non-Cartesian sampling of k-space.

11. The method of claim 1, wherein the subsets comprise three-dimensional or higher-dimensional k-space data.

12. The method of claim 1, wherein the gradient images are computed by determining spatial derivatives of the image values of the single-subset MR images along at least one spatial direction.

13. A magnetic resonance (MR) device including at least one main magnet coil for generating a uniform, steady magnetic field B0 within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is configured to perform the following steps:
    generating MR signals by subjecting the object to a MR imaging sequence of at least one RF pulse and switched magnetic field gradients;
    acquiring the MR signals as a plurality of temporally successive subsets, each subset comprising a number of k-space profiles with sub-sampling of k-space, wherein the subsets complement each other to form a fully sampled set of k-space profiles;
    reconstructing a single-subset MR image from each subset;
    computing a gradient MR image from each single-subset MR image;
    detecting motion by comparing the gradient MR images with each other;
    applying motion correction to at least one of the subsets according to the detected motion; and
    reconstructing a motion-corrected MR image from the fully sampled set of k-space profiles formed from the motion-corrected subsets.

14. A computer program to be run on a MR device, which computer program comprises instructions stored on a machine readable medium for:
    generating a MR imaging sequence of at least one RF pulse and switched magnetic field gradients;
    acquiring MR signals as a plurality of temporally successive subsets, each subset comprising a number of k-space profiles with sub-sampling of k-space, wherein the subsets complement each other to form a fully sampled set of k-space profiles;

reconstructing a single-subset MR image from each subset;

computing a gradient MR image from each single-subset MR image;

detecting motion by comparing the gradient MR images with each other;

applying motion correction to at least one of the subsets according to the detected motion; and reconstructing a motion-corrected MR image from the fully sampled set of k-space profiles formed from the motion-corrected subsets.

15. The method of claim 1, wherein in computation of the gradient MR image includes reducing the inner k-space's influence.

16. The method of claim 15, wherein the gradient MR image is computed as voxel-wise spatial derivative of the image values in at least one spatial direction of a corresponding single-subset MR images.

17. A magnetic resonance (MR) device comprising:

a number of gradient coils for generating switched magnetic field gradients in different spatial directions within an examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is configured to:

generate MR signals by subjecting the object to a MR imaging sequence of at least one RF pulse and switched magnetic field gradients;

acquire the MR signals as a plurality of temporally successive subsets, each subset comprising a number of k-space profiles with sub-sampling of k-space, wherein the subsets complement each other to form a fully sampled set of k-space profiles;

reconstruct a single-subset MR image from each subset;

compute a gradient MR image from each single-subset MR image;

detecting motion by comparing the gradient MR images with each other;

re-acquire one or more motion-corrupted subsets; and reconstruct a final MR image from the fully sampled set of k-space profiles formed from the not motion-corrupted subsets and the re-acquired subsets.

18. The device of claim 17, wherein the field-of-view of the k-space sampling is adapted in the step of re-acquiring the subsets according to the detected motion.

* * * * *